(12) United States Patent
Hayashi et al.

(10) Patent No.: US 11,335,831 B2
(45) Date of Patent: May 17, 2022

(54) OPTICAL DEVICE CASE AND OPTICAL DEVICE

(71) Applicants: Sharp Kabushiki Kaisha, Sakai (JP); GEOMATEC CO., LTD., Yokohama (JP)

(72) Inventors: Hidekazu Hayashi, Sakai (JP); Hiroyuki Sugawara, Kurihara (JP)

(73) Assignees: SHARP KABUSHIKI KAISHA, Sakai (JP); GEOMATEC CO., LTD., Kanagawa (JP)

( * ) Notice: Subject to any disclaimer, the term of this patent is extended or adjusted under 35 U.S.C. 154(b) by 132 days.

(21) Appl. No.: 16/497,812

(22) PCT Filed: Mar. 12, 2018

(86) PCT No.: PCT/JP2018/009505
§ 371 (c)(1),
(2) Date: Dec. 23, 2019

(87) PCT Pub. No.: WO2018/180421
PCT Pub. Date: Oct. 4, 2018

(65) Prior Publication Data
US 2020/0144456 A1   May 7, 2020

(30) Foreign Application Priority Data
Mar. 29, 2017 (JP) .............. JP2017-066068

(51) Int. Cl.
*H01L 33/48* (2010.01)
*H01L 27/146* (2006.01)
(Continued)

(52) U.S. Cl.
CPC ...... *H01L 33/483* (2013.01); *H01L 27/14618* (2013.01); *H01L 27/14625* (2013.01); *H01L 31/0203* (2013.01); *H01L 33/58* (2013.01)

(58) Field of Classification Search
CPC ............. H01L 33/483; H01L 27/14618; H01L 27/14625; H01L 31/0203; H01L 33/58;
(Continued)

(56) References Cited

U.S. PATENT DOCUMENTS 10,907,019 B2 * 2/2021 Nakahara .................. B32B 3/30
2003/0205475 A1 11/2003 Sawitowski
(Continued)

FOREIGN PATENT DOCUMENTS

AU   2001256323 B2   11/2001
CN      101007645 A    8/2007
(Continued)

*Primary Examiner* — Charles D Garber
*Assistant Examiner* — S M Sohel Imtiaz
(74) *Attorney, Agent, or Firm* — Keating & Bennett, LLP

(57) ABSTRACT

An optical device case (100A) of an embodiment includes: a light-transmitting window member (20A); and a housing (10) which has a space for accommodating a light-receiving element and/or a light-emitting element (OE), wherein the window member (20A) includes a light-transmitting member (22), a polymer film (50) provided on an outer surface of the light-transmitting member (22), the polymer film (50) having a moth-eye structure at its surface, a contact angle of the surface with respect to water being not less than 140°, and a resistance heater (24) provided on an inner surface of the light-transmitting member (22).

12 Claims, 3 Drawing Sheets

(51) Int. Cl.
*H01L 31/0203* (2014.01)
*H01L 33/58* (2010.01)

(58) Field of Classification Search
CPC ........... H01L 31/0236; H01L 31/02325; H01L 25/167; G02B 1/118; G03B 17/56; G08G 1/095
See application file for complete search history.

(56) References Cited

U.S. PATENT DOCUMENTS

| | | | | |
|---|---|---|---|---|
| 2005/0254358 | A1* | 11/2005 | Kosako | H04N 5/2252 |
| | | | | 369/44.14 |
| 2007/0159698 | A1* | 7/2007 | Taguchi | G02B 5/045 |
| | | | | 359/586 |
| 2009/0085134 | A1* | 4/2009 | Park | H01L 27/14683 |
| | | | | 257/432 |
| 2009/0284638 | A1* | 11/2009 | Chang | G02B 7/021 |
| | | | | 348/335 |
| 2012/0200932 | A1* | 8/2012 | Minari | B29C 33/56 |
| | | | | 359/601 |
| 2012/0318772 | A1* | 12/2012 | Minoura | C25D 11/045 |
| | | | | 216/52 |
| 2013/0265477 | A1 | 10/2013 | Furusato et al. | |
| 2013/0270419 | A1* | 10/2013 | Singh | H01L 27/14685 |
| | | | | 250/208.1 |
| 2014/0152471 | A1* | 6/2014 | Suzuki | H01M 10/6561 |
| | | | | 340/928 |
| 2014/0197036 | A1 | 7/2014 | Isurugi et al. | |
| 2015/0008177 | A1* | 1/2015 | Yajima | C04B 38/0019 |
| | | | | 210/488 |
| 2015/0140154 | A1* | 5/2015 | Isurugi | C25D 11/12 |
| | | | | 425/177 |
| 2017/0066207 | A1 | 3/2017 | Hayashi et al. | |
| 2019/0016084 | A1 | 1/2019 | Hayashi et al. | |

FOREIGN PATENT DOCUMENTS

| | | | |
|---|---|---|---|
| CN | 103364850 A | | 10/2013 |
| JP | 56-87001 A | | 7/1981 |
| JP | S-5687001 | * | 7/1981 |
| JP | 04-230906 A | | 8/1992 |
| JP | 2008-123830 A | | 5/2008 |
| JP | 4265729 B2 | | 5/2009 |
| JP | 2009-166502 A | | 7/2009 |
| JP | 2014-109970 A | | 6/2014 |
| JP | 2015-108882 A | | 6/2015 |
| JP | 2015108882 A | * | 6/2015 |
| JP | 2016-122352 A | | 7/2016 |
| JP | 2016122352 A | * | 7/2016 |
| WO | 2011/125486 A1 | | 10/2011 |
| WO | 2012/137664 A1 | | 10/2012 |
| WO | 2013/183576 A1 | | 12/2013 |
| WO | 2016/174893 A1 | | 11/2016 |
| WO | 2017/115694 A1 | | 7/2017 |

\* cited by examiner (a)

(b)

(c)

OPTICAL DEVICE CASE AND OPTICAL DEVICE

TECHNICAL FIELD

The present invention relates to an optical device case, particularly an optical device case which is capable of accommodating a light-emitting element and/or a light-receiving element, and to an optical device.

BACKGROUND ART

An optical device installed outdoors cannot carry out its function if snow adheres to a light-transmitting window member which is to receive and/or emit light and therefore has a contrivance for preventing adhesion of snow and/or melting snow.

For example, Patent Document No. 1 discloses a signal light member which includes at its surface a minute uneven structure which has an antireflection function and a snow-repellent function. According to Patent Document No. 1, the contact angle of the surface that has the minute uneven structure with respect to water is not less than 135° so that adhesion of snow can be prevented.

Patent Document No. 2 discloses an LED traffic signal light of a snow-melting type. According to Patent Document No. 2, a lens cover (window member) is heated by a far-infrared heat generating sheet, whereby adhesion of snow to the lens cover can be suppressed.

In the traffic signal light illustrated herein, LEDs are used as light-emitting elements, so that the amount of heat emitted from the light-emitting elements is small and/or the electric power from the power supply decreases (for example, not more than 20 W). Therefore, preventing adhesion of snow is difficult as compared with a device which uses light bulbs as light-emitting elements. The problems of snow adhesion are not limited to this but common among various optical devices installed outdoors, for example, lamps for various signal lights, cameras (for example, surveillance cameras, car cameras), and optical detection devices (for example, vehicle detectors).

On the other hand, the present applicants conceived a method for producing an antireflection film which has a moth-eye structure (antireflection surface) using an anodized porous alumina layer. By using an anodized porous alumina layer, a mold which has an inverted moth-eye structure can be manufactured with high mass productivity (for example, Patent Documents Nos. 3 to 7). The disclosures of Patent Documents Nos. 3 to 7 are hereby incorporated herein by reference in their entireties.

CITATION LIST

Patent Literature

Patent Document No. 1: Japanese Laid-Open Patent Publication No. 2015-108882
Patent Document No. 2: Japanese Laid-Open Patent Publication No. 2014-109970
Patent Document No. 3: Japanese Patent No. 4265729
Patent Document No. 4: Japanese Laid-Open Patent Publication No. 2009-166502
Patent Document No. 5: WO 2011/125486
Patent Document No. 6: WO 2012/137664
Patent Document No. 7: WO 2013/183576

SUMMARY OF INVENTION

Technical Problem

However, according to research conducted by the present inventors, there is a probability that the methods disclosed in Patent Documents Nos. 1 and 2 cannot sufficiently suppress adhesion of snow. In the configuration of Patent Document No. 1, when water drops or ice once attach to a surface, adhesion of snow cannot be effectively prevented. In the configuration of Patent Document No. 2, there is a concern that at some environmental temperatures, snow cannot be sufficiently melted only by radiant heat from the far-infrared heat generating sheet.

In view of the foregoing circumstances, an object of the present invention is to provide an optical device case and an optical device which are capable of more surely preventing adhesion of snow than the above-described conventional techniques.

Solution to Problem

An optical device case of an embodiment of the present invention includes: a light-transmitting window member; and a housing which has a space for accommodating a light-receiving element and/or a light-emitting element, wherein the window member includes a light-transmitting member, a polymer film provided on an outer surface of the light-transmitting member, the polymer film having a moth-eye structure at its surface, a contact angle of the surface with respect to water being not less than 140°, and a resistance heater provided on an inner surface of the light-transmitting member.

In one embodiment, the optical device case further includes a hydrophilic layer provided on an inner side of the resistance heater, wherein a contact angle of a surface of the hydrophilic layer with respect to water is not more than 20°.

In one embodiment, the hydrophilic layer includes a polymer layer which has a moth-eye structure at its surface.

In one embodiment, the hydrophilic layer includes a porous alumina layer.

In one embodiment, the porous alumina layer has an inverted moth-eye structure at its surface.

In one embodiment, the resistance heater includes a transparent conductive layer formed on the inner surface of the light-transmitting member, and the porous alumina layer is provided on the transparent conductive layer.

In one embodiment, the porous alumina layer contains Ti.

An optical device of an embodiment of the present invention is a lamp for a signal light, including: the optical device case as set forth in any of the foregoing paragraphs; and an LED element provided inside the optical device case.

An optical device of an embodiment of the present invention is a camera including: the optical device case as set forth in any of the foregoing paragraphs; and an image sensor provided inside the optical device case. The camera is, for example, a surveillance camera (or security camera) or a car camera.

An optical device of an embodiment of the present invention is an optical detection device including: the optical device case as set forth in any of the foregoing paragraphs; and a photosensor provided inside the optical device case.

Advantageous Effects of Invention

According to an embodiment of the present invention, an optical device case and an optical device which are capable of more surely preventing adhesion of snow than the above-described conventional techniques are provided.

DESCRIPTION OF EMBODIMENTS

Figure 1:
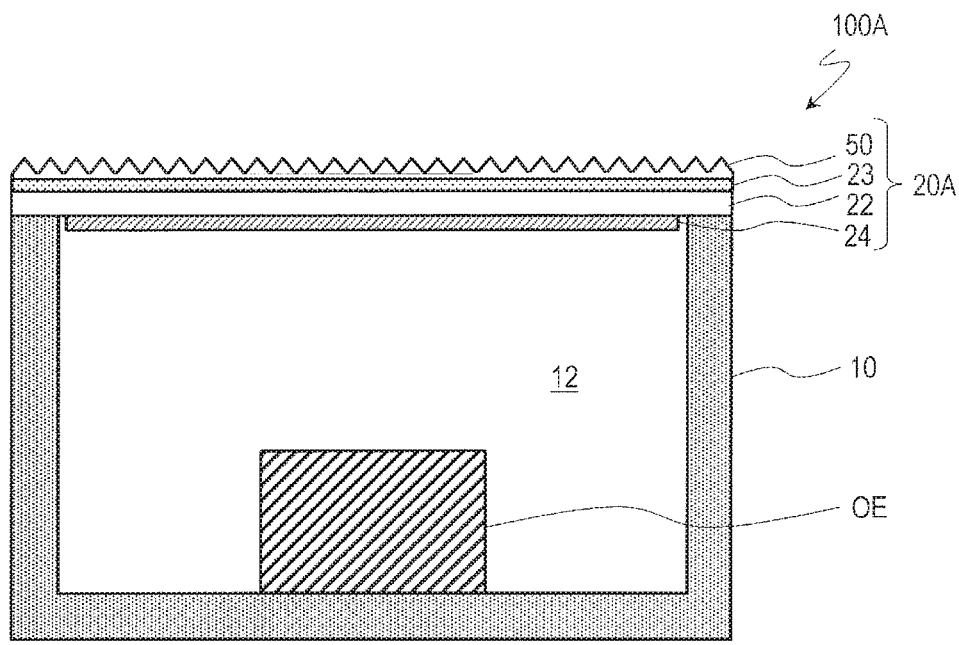
FIG. 1 A schematic cross-sectional view of an optical device case 100A according to Embodiment 1 of the present invention.

Hereinafter, the configurations of optical device cases of embodiments of the present invention are described with reference to the drawings. The embodiments of the present invention are not limited to illustrated embodiments. In the following description, components which have the same function are designated by a common reference numeral, and repetitive description thereof is avoided.

Embodiment 1

FIG. 1 shows a schematic cross-sectional view of an optical device case 100A of Embodiment 1 of the present invention. The case 100A includes a housing 10 which has a space 12 for accommodating an optical element OE (light-receiving element and/or light-emitting element) and a window member 20A which is capable of transmitting light. The window member 20A includes a light-transmitting member 22, a polymer film 50 provided on the outer surface of the light-transmitting member 22, and a resistance heater 24 provided on the inner surface of the light-transmitting member 22. The polymer film 50 is secured to the outer surface of the light-transmitting member 22 via, for example, an adhesive layer 23 as illustrated herein. As a matter of course, the present invention is not limited to this example. The polymer film 50 can be secured to the outer surface of the light-transmitting member 22 by a different known method. For example, the polymer film 50 may be directly adhered to the light-transmitting member 22 by thermocompression bonding. The light-transmitting member 22 may be, for example, a transparent substrate (for example, glass substrate or plastic substrate) or may be a lens (which is made of glass or plastic).

The polymer film 50 has a moth-eye structure at its surface. The contact angle of the surface with respect to water is not less than 140°. That is, the polymer film 50 has both antireflection function and ultrahydrophobicity. Details of the polymer film 50 will be described later with reference to FIG. 5.

The optical element OE is, for example, an LED element OE. The entirety of the optical device case 100A in which the LED element OE is accommodated may be a lamp for a signal light. The polymer film 50 has an ultrahydrophobic surface and therefore can suppress and prevent adhesion of water drops. Further, since the resistance heater 24 is provided on the inner side of the light-transmitting member 22, snow (ice) adhered to the surface of the polymer film 50 can be melted by supplying electric power to the resistance heater 24, even if snow (ice) adheres to the surface of the polymer film 50.

The resistance heater 24 can be formed using, for example, a metal thin film or transparent electrically-conductive film (oxide electrically-conductive film). The resistance heater 24 utilizes Joule heat and can control the amount of heat production by the resistance value and the voltage (power). For example, in the case of a lamp for an LED signal light, the resistance value of the resistance heater 24 (material, film thickness, wire width and length of pattern, etc.) may be set depending on the largeness of the light-transmitting member 22 (if the periphery of the light-transmitting member 22 is covered with a cover or the like, the largeness of a portion through which light actually transmits) such that the snow can sufficiently melt at about 120 V (15 W). The thickness and pattern of the metal thin film may be determined in consideration of transmissivity. When a transparent conductive layer is used, patterning is not necessary and the resistance value can be easily controlled by, for example, the film formation conditions and the film thickness.

Since the resistance heater 24 is in contact with the light-transmitting member 22, the light-transmitting member 22 can be heated surely as compared with a case where the far-infrared heat generating sheet disclosed in Patent Document No. 2 is used. The resistance heater 24 has greater durability than the far-infrared heat generating sheet. As the metal thin film, for example, a multilayer film such as Cr (50 nm)/Ni (150 nm)/solder (lower layer/middle layer/upper layer), Cr (50 nm)/Ni (150 nm)/Cu (lower layer/middle layer/upper layer), or the like, can be used.

A circuit (not shown) for supplying electric power to the LED element OE or the resistance heater 24 may be provided inside the housing 10 or may be provided outside the housing 10.

Although in the case described herein the optical element OE is a light-emitting element (LED element), when a light-receiving element (image sensor, photosensor, or the like) is used as the optical element OE, the antireflection function of the polymer film 50 can contribute to increasing the amount of light which can be received by the light-receiving element. The polymer film 50 that has a moth-eye structure carries out an excellent antireflection function for light of wide incidence angles and wide wavelength range. Therefore, light in an excellent state can be guided to the light-receiving element.

Embodiment 2

Figure 2:
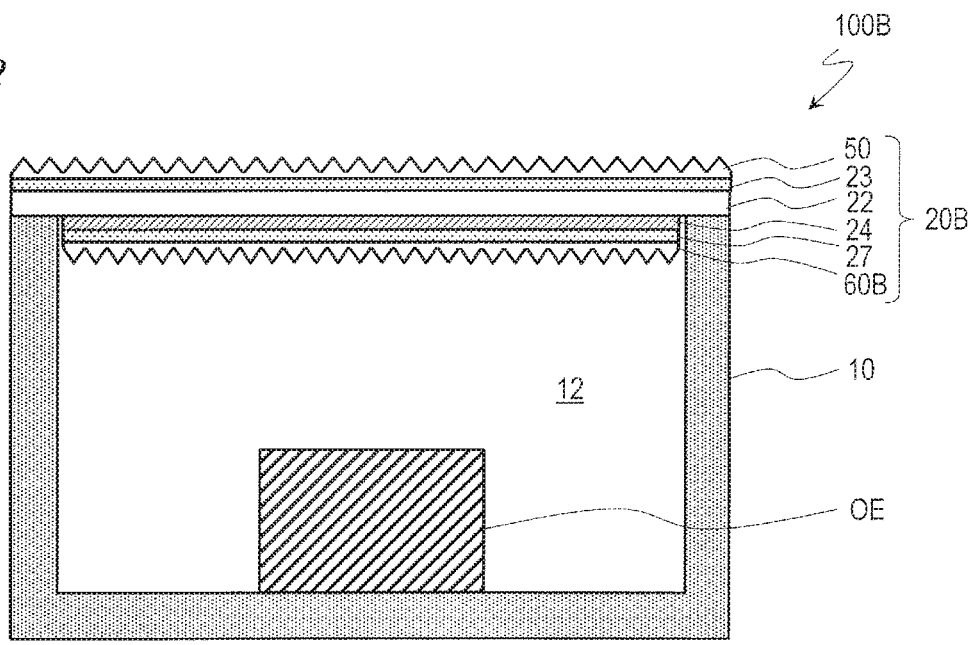
FIG. 2 A schematic cross-sectional view of an optical device case 100B according to Embodiment 2 of the present invention.

FIG. 2 shows a schematic cross-sectional view of an optical device case 100B of Embodiment 2 of the present invention. The optical device case 100B further includes a hydrophilic layer 60B which is provided on the inner side of the resistance heater 24 of the optical device case 100A of FIG. 1. The contact angle of the surface of the hydrophilic layer 60B with respect to water is not more than 20°, preferably not more than 10°.

Sometimes dew condensation forms on the inner surface of the window member 20B of the optical device case 100B. When dew condensation forms, light is scattered by water drops. Therefore, for example, when the optical element OE is an image sensor, a clear picture cannot be taken. Alternatively, when the optical element OE is a photosensor, the intensity of light that reaches the photosensor decreases.

Since the optical device case 100B has the hydrophilic layer 60B on the inner side of the resistance heater 24, dew condensation can be suppressed. The dew formation preventing effect improves as the hydrophilicity of the surface of the hydrophilic layer 60B increases. The contact angle of the surface of the hydrophilic layer 60B with respect to water is preferably not more than 10°. Even if dew condensation (condensation of water vapor) forms on a surface of high hydrophilicity, water spreads over the hydrophilic surface so that the water does not remain in the form of drops. As a result, light would not be scattered so that it cannot be perceived as dew condensation.

The hydrophilic layer 60B illustrated herein is a polymer layer 60B which has a moth-eye structure at its surface. When the surface has a moth-eye structure, the surface carries out an antireflection function so that the reflection at the inner surface of the window member 20B can be reduced. Therefore, when the optical element OE is a light-emitting element, the light extraction efficiency improves. When the optical element OE is a light-receiving element, light in a better state can be guided to the light-receiving element than in the optical device case 100A. The polymer layer 60B can be, for example, one of the antireflection films disclosed in WO 2017/115694 the contact angle with respect to water of the surface of which is not more than 20°. The disclosure of WO 2017/115694 is hereby incorporated herein by reference in its entirety.

Herein, the hydrophilic layer 60B is secured to the resistance heater 24 via an adhesive layer 27. As a matter of course, the method of securing the hydrophilic layer 60B to the resistance heater 24 is not limited to the above-described example, but various known methods can be used.

Embodiment 3

Figure 3:
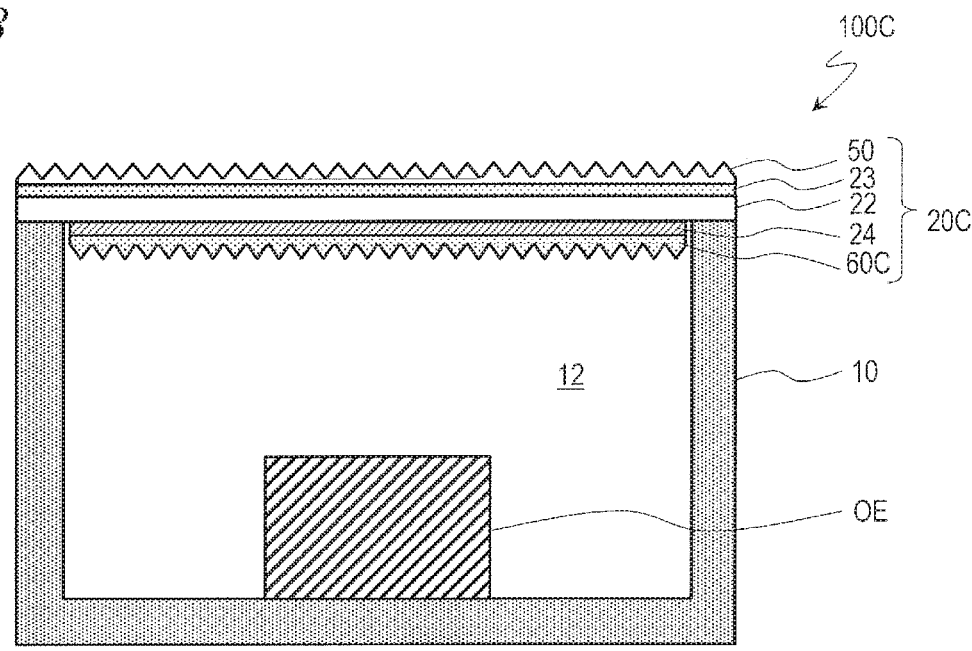
FIG. 3 A schematic cross-sectional view of an optical device case 100C according to Embodiment 3 of the present invention.

FIG. 3 shows a schematic cross-sectional view of an optical device case 100C of Embodiment 3 of the present invention. The optical device case 100C further includes a hydrophilic layer 60C which is provided on the inner side of the resistance heater 24 of the optical device case 100A of FIG. 1. The hydrophilic layer 60C is a porous alumina layer 60C. The contact angle of the surface of the hydrophilic layer 60C with respect to water is not more than 10°.

The porous alumina layer 60C has an inverted moth-eye structure at its surface. This inverted moth-eye structure is the same as the surface structure of a mold for production of an antireflection film which has a moth-eye structure. The porous alumina layer 60C is preferably forme as described below.

On the light-transmitting member 22, a transparent conductive layer 24 is formed as the resistance heater 24. The transparent conductive layer 24 is, for example, an TTO (indium-doped tin oxide) layer. On the ITO layer, an ATO (antimony-doped tin oxide) layer and/or an FTO (fluorine-doped tin oxide) layer may be formed.

On the transparent conductive layer 24, an Al layer or Al alloy layer is formed. The Al layer or Al alloy layer is anodized using the transparent conductive layer 24 as an electrode, whereby a porous alumina layer is formed. Thereafter, etching is performed so as to enlarge the pore diameter. Thereafter, anodization and etching are alternately repeated, whereby a porous alumina layer 60C is formed which has pores (minute recessed portions) of a desired shape (conical shape). The number of repetitions of the anodization and the etching (for example, 5 times of the anodization, 4 times of the etching) can be suitably adjusted. Note that, however, the layer is thoroughly anodized such that Al or Al alloy does not remain. This is for the purpose of preventing deterioration of the light transmissibility of the window member 20C. Using the transparent conductive layer 24 as an electrode enables thorough anodization of the Al layer or Al alloy layer.

It is preferred to use, as the Al alloy layer, an aluminum alloy layer which contains aluminum and a metal element of which the absolute value of the difference in standard electrode potential from aluminum is not more than 0.64 V (for example, Ti, Nd, Mn, Mg, Zr, V and Pb; the proportion of the metal element to the entirety is less than 10 mass %) as disclosed in Patent Document No. 6. For example, an aluminum alloy which contains Ti can be suitably used. Alternatively, as disclosed in Patent Document No. 7, an aluminum alloy layer may be used which contains aluminum, a metal element other than aluminum, and nitrogen. The proportion of nitrogen contained in the aluminum alloy layer is preferably not less than 0.5 mass % and not more than 5.7 mass %. The proportion of the metal element (for example, Ti) contained in the aluminum alloy layer is preferably not less than 1.0 mass % and not more than 1.9 mass %. Such an Al alloy layer rarely contains abnormal grains. Note that a finally-formed porous alumina layer naturally contains the metal element contained in the alloy. For example, a porous alumina layer formed by anodizing an Al alloy which contains Ti contains Ti.

In the etching step, galvanic corrosion can occur between the ITO layer and the Al alloy layer. This can be prevented by forming an ATO layer and/or an FTO layer between the ITO layer and the Al alloy layer. Alternatively, as the material of the Al alloy layer, Al—Ni—La (DC-Al manufactured by KOBELCO research institute) or Al—Ni—B (ACX manufactured by MITSUI MINING & SMELTING CO., LTD.) may be used.

The porous alumina layer 60C that has the inverted moth-eye structure also has an antireflection function although it is somewhat inferior to that of the polymer layer 60B that has the moth-eye structure. Further, the porous alumina layer 60C has high thermal conductivity and therefore functions such that the temperature distribution across the light-transmitting member 22 becomes uniform. Since the porous alumina layer 60C has a hydrophilic surface, as a matter of course, the porous alumina layer 60C also produces the effect of suppressing dew condensation.

Embodiment 4

Figure 4:
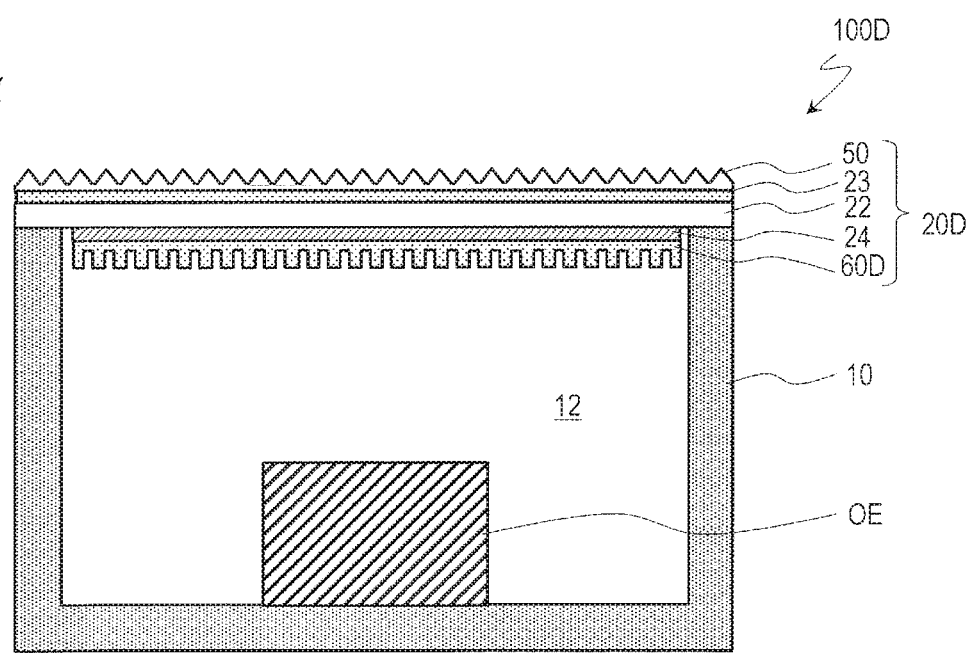
FIG. 4 A schematic cross-sectional view of an optical device case 100D according to Embodiment 4 of the present invention.

FIG. 4 shows a schematic cross-sectional view of an optical device case 100D of Embodiment 4 of the present invention. A window member 20D of the optical device case 100D includes a porous alumina layer 60D instead of the porous alumina layer 60C that is provided on the inner side of the resistance heater 24 of the optical device case 100C of FIG. 3. The contact angle of the surface of the porous alumina layer 60D with respect to water is not more than 10°.

The porous alumina layer 60D has cylindrical pores as schematically shown in FIG. 4. Therefore, the porous alumina layer 60D can be formed only by anodization, without etching which is required in forming the porous alumina layer 60C that has conical pores. As a matter of course, the porous alumina layer 60D is the same as the porous alumina layer 60C of Embodiment 3 in that the Al layer or Al alloy layer is thoroughly anodized. Since the pores of the porous alumina layer 60D are cylindrical, the antireflection effect of the porous alumina layer 60D is inferior to that of the porous alumina layer 60C. However, the other effects can be achieved, and formation of the layer is advantageously easier.

[Polymer Film]

Figure 5:
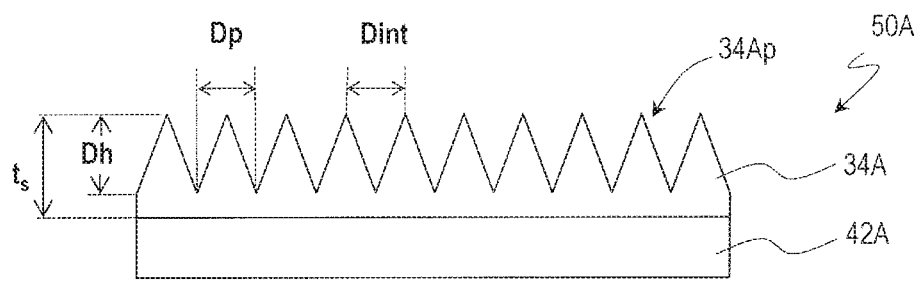
FIG. 5 (a), (b) and (c) are schematic cross-sectional views of a polymer film included in an optical device case according to an embodiment of the present invention.
Figure 5:
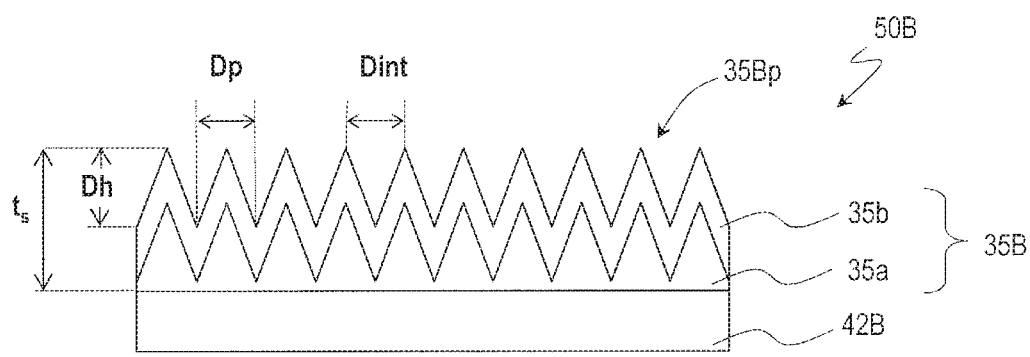
Figure 5:
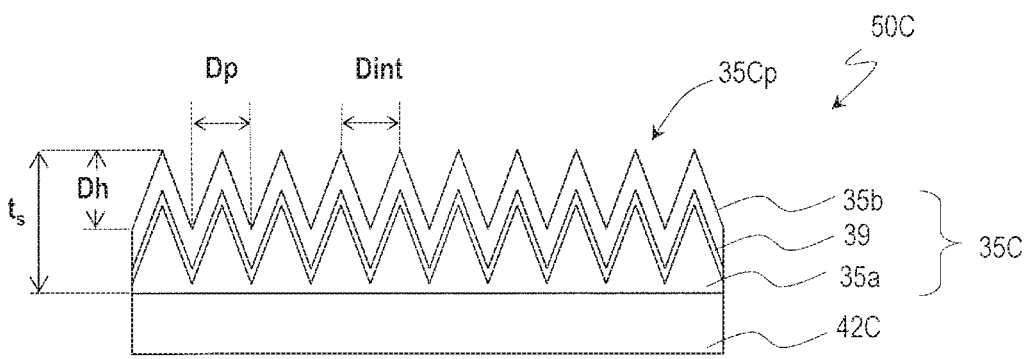

Next, the configuration and production method of the polymer film 50 are described with reference to FIG. 5. The polymer film 50 has a moth-eye structure at its surface, and the contact angle of the surface with respect to water is not less than 140°.

FIG. 5(a) to FIG. 5(c) show schematic cross-sectional views of a polymer film included in an optical device case of an embodiment of the present invention.

The polymer film 50A shown in FIG. 5(a) includes a base film 42A and a photocured resin layer 34A provided on the base film 42A. The photocured resin layer 34A has a plurality of raised portions 34Ap over its surface. The plurality of raised portions 34Ap constitute a moth-eye structure. The photocured resin layer 34A is typically formed by curing a photocurable resin (preferably, UV-curable resin) and is therefore hereinafter referred to as photocured resin layer 34A. Note that, however, the layer 34A can also be formed using a thermosetting resin.

The thickness of the base film 42A is, for example, not less than 1 µm and not more than 1,000 µm. The thickness of the photocured resin layer 34A is, for example, not less than 0.1 µm and not more than 100 µm.

When viewed in a normal direction of the photocured resin layer 34A, the two-dimensional size of the raised portions 34Ap, $D_p$, is in the range of more than 20 nm and less than 500 nm. Herein, the "two-dimensional size" of the raised portions 34Ap refers to the diameter of a circle equivalent to the area of the raised portions 34Ap when viewed in a normal direction of the surface. For example, when the raised portions 34Ap have a conical shape, the two-dimensional size of the raised portions 34Ap is equivalent to the diameter of the base of the cone. The typical adjoining distance of the raised portions 34Ap, $D_{int}$, is more than 20 nm and not more than 1000 nm. When the raised portions 34Ap are densely arranged so that there is no gap between adjoining raised portions 34Ap (e.g., the bases of the cones partially overlap each other) as illustrated in FIG. 5(a), the two-dimensional size of the raised portions 34Ap, $D_p$, is equal to the adjoining distance $D_{int}$. The typical height of the raised portions 34Ap, $D_h$, is not less than 50 nm and less than 500 nm. The thickness of the photocured resin layer 34A, ts, is for example not less than 0.1 µm and not more than 100 µm.

The photocured resin layer 34A shown in FIG. 5(a) has the moth-eye structure similar to the antireflection films disclosed in Patent Documents Nos. 3 to 7. From the viewpoint of producing an antireflection function, it is preferred that the surface has no flat portion, and the raised portions 34Ap are densely arranged. Further, the raised portions 34Ap preferably has a such shape that the cross-sectional area (a cross section parallel to a plane which is orthogonal to an incoming light ray, e.g., a cross section parallel to the surface of the base film 42A) increases from the air side to the base film 42A side, e.g., a conical shape. From the viewpoint of suppressing interference of light, it is preferred that the raised portions 34Ap are arranged without regularity, preferably randomly.

A mold (hereinafter, referred to as "moth-eye mold") for forming the moth-eye structure such as illustrated in FIG. 5(a) at the surface has an inverted moth-eye structure obtained by inverting the moth-eye structure. Using an anodized porous alumina layer which has the inverted moth-eye structure as a mold without any modification enables inexpensive production of the moth-eye structure. Particularly when a moth-eye mold in the shape of a hollow cylinder is used, the moth-eye structure can be efficiently formed by a roll-to-roll method. Such a moth-eye mold can be manufactured by the formation method similar to that of the above-described porous alumina layer 60C of Embodiment 3. Note that, however, it is not necessary to thoroughly anodize an aluminum film or aluminum alloy. A moth-eye mold and a production method of a synthetic polymer film (antireflection film) which has a moth-eye structure at its surface can be manufactured by, for example, the methods disclosed in Patent Documents Nos. 3 to 7. A synthetic polymer film which has a moth-eye structure at its surface can be produced by, for example, applying a UV-curable resin (e.g., acrylic resin) onto a base film and irradiating the UV-curable resin with ultraviolet light while the UV-curable resin is pressed against the moth-eye mold, whereby the UV-curable resin is cured. The surface of the cured UV-curable resin has a moth-eye structure.

By selecting a photocurable resin (e.g., acrylic resin) that forms the photocured resin layer 34A shown in FIG. 5(a), the photocured resin layer 34A can be realized which has such a water-repellent surface that the contact angle of the surface with respect to water is not less than 140°. For example, by mixing a fluoric acrylic resin or a fluoric mold releasing agent into the acrylic resin, a water-repellent surface can be formed.

Further, it may be a multilayer structure including an upper resin layer 35b in which the proportion of contained fluorine is high and a lower resin layer 35a in which the proportion of contained fluorine is low or no fluorine is contained, like the photocured resin layers 35B and 35C shown in FIG. 5(b) and FIG. 5(c). A method of forming such a synthetic polymer film which has a water-repellent surface is disclosed in WO 2016/174893 and is therefore briefly described herein. The disclosure of WO 2016/174893 is hereby incorporated herein by reference in its entirety.

A polymer film 50B shown in FIG. 5(b) includes a base film 42B and a photocured resin layer 35B provided on the base film 42B. The photocured resin layer 35B has a plurality of raised portions 35Bp at its surface. The plurality of raised portions 35Bp constitute a moth-eye structure. The photocured resin layer 35B includes a lower resin layer 35a and an upper resin layer 35b. In the upper resin layer 35b, the proportion of contained fluorine is high so that the upper resin layer 35b exhibits strong water repellency. In the lower resin layer 35a, the proportion of contained fluorine is lower than in the upper resin layer 35b, or no fluorine is contained.

The raised portions 35Bp of the photocured resin layer 35B are substantially the same as the raised portions of the lower resin layer 35a in two-dimensional size Dp, height Dh and adjoining distance $D_{int}$. When viewed in the normal direction of the photocured resin layer 35B, the two-dimensional size Dp of the raised portions 35Bp is in the range of more than 20 nm and less than 500 nm. The thickness of the upper resin layer 35b is, for example, not more than 10 nm. The thickness of the upper resin layer 35b is preferably not less than 0.1 µm and not more than 15 µm, more preferably not less than 1 µm and not more than 10 µm, still more preferably not less than 2 µm and not more than 8 µm, and particularly preferably not less than 5 µm and not more than 8 µm. The thickness of the upper resin layer 35b refers to a thickness in the normal direction of the photocured resin layer 35B. The thickness ts of the photocured resin layer 35B is, for example, greater than the thickness of the lower resin layer 35a by the thickness of the upper resin layer 35b. The thickness of the lower resin layer 35a may be, for example, equal to the thickness of the photocured resin layer 34A.

The polymer film 50B is formed, for example, as follows.

First, a lower resin layer 35a is formed on a base film 42B as in the polymer film 50A shown in FIG. 5(a). The surface of the lower resin layer 35a does not need to have water repellency whereas the photocured resin layer 34A of the polymer film 50A has a water-repellent surface.

Then, as shown in FIG. 5(b), an upper resin layer 35b which contains a fluoric mold releasing treatment agent is formed on the lower resin layer 35a. When the upper resin layer 35b is formed, the lower resin layer 35a has already been cured. The upper resin layer 35b is formed so as to cover at least part of the plurality of raised portions of the lower resin layer 35a. The upper resin layer 35b may be formed so as to cover all the plurality of raised portions of the lower resin layer 35a.

The fluoric mold releasing treatment agent refers to a compound which does not react with a monomer, i.e., which does not directly or indirectly form a bond (covalent bond) to the skeleton of the resin. The upper resin layer 35b that contains the fluoric mold releasing treatment agent can be formed of various fluoric mold releasing treatment agents which are commercially available as, for example, fluoric mold releasing agents, fluoric coating agents, fluoric anti-fingerprint agents, etc. The fluoric mold releasing treatment agent has, for example, a fluorine-containing hydrocarbon chain and an alkoxysilane at the terminal. The fluoric mold releasing treatment agent has an alkoxysilane and therefore contains a silicon (Si) element. The fluorine-containing hydrocarbon chain may contain an ether bond. The upper resin layer 35b can be formed using, for example, a vapor deposition method or a spray method. The viscosity of the resin that forms the upper resin layer 35b is, for example, 0.1 cP to 100 cP. When a fluoric mold releasing treatment agent which has an alkoxysilane at the terminal is used, it is preferred that the surface of the lower resin layer 35a is subjected to an oxygen ($O_2$) plasma treatment before the fluoric mold releasing treatment agent is applied to the surface of the lower resin layer 35a.

A polymer film 50C shown in FIG. 5(c) includes a base film 42C and a photocured resin layer 35C provided on the base film 42C. The photocured resin layer 35B has a plurality of raised portions 35Cp at its surface. The plurality of raised portions 35Cp constitute a moth-eye structure. The photocured resin layer 35C includes a lower resin layer 35a, an upper resin layer 35b, and an oxide layer 39 provided between the lower resin layer 35a and the upper resin layer 35b. In the upper resin layer 35b, the proportion of contained fluorine is high so that the upper resin layer 35b exhibits strong water repellency. In the lower resin layer 35a, the proportion of contained fluorine is lower than in the upper resin layer 35b, or no fluorine is contained.

The photocured resin layer 35C is realized by forming an oxide layer (e.g., silicon dioxide layer) 39 on the lower resin layer 35a after the lower resin layer 35a is formed and before the upper resin layer 35b is formed in the formation process of the photocured resin layer 35B. Before the oxide layer 39 is formed, an oxygen ($O_2$) plasma treatment is preferably performed on the surface of the lower resin layer 35a. The oxide layer 39 reacts with an alkoxysilane contained in the upper resin layer 35b, thereby improving the adhesion between the upper resin layer 35b and the lower resin layer 35a. The thickness of the oxide layer 39 is, for example, 10 nm. The thickness ts of the photocured resin layer 35C that includes the oxide layer 39 is, for example, greater than the thickness of the lower resin layer 35a by the sum of the thickness of the upper resin layer 35b and the thickness of the oxide layer 39. The thickness of the lower resin layer 35a may be, for example, equal to that of the photocured resin layer 34A.

The polymer film 50B that has the configuration shown in FIG. 5(b) can be produced by any other method than the foregoing, for example, various methods disclosed in WO 2016/174893. The polymer film 50B can be realized by, for example, applying a urethane acrylate resin (e.g., thickness: 7 μm), which is to form the lower resin layer 35a, on a PET film (e.g., thickness: 75 μm), without curing the urethane acrylate resin, applying a mixture of a fluorine-containing acrylic monomer and a reactive diluent (monofunctional monomer, for example acryloyl morpholine), which is to form the upper resin layer 35b (e.g., thickness: 1.3 μm), and irradiating the resultant structure with ultraviolet light (e.g., irradiation amount: 200 mJ/cm$^2$) from the base film side while it is pressed against a predetermined moth-eye mold, whereby the lower resin layer 35a and the upper resin layer 35b are cured. Note that, when necessary, a photopolymerization initiator is mixed into the above-described resin material. The surface of the moth-eye mold may be treated with, for example, a fluoric mold releasing agent.

(Results of Experiments)

As the polymer film that has ultrahydrophobicity, sample films which had the configuration shown in FIG. 5(b) were produced. Specifically, the polymer film 50C was produced in the same way as in Example 1 disclosed in WO 2016/174893. The materials and curing conditions used for production of the sample films and the moth-eye structure of the sample films are as follows:

(Base Film)
PET (manufactured by TORAY INDUSTRIES, INC., product name: Lumirror (registered trademark) U34, thickness 75 μm)

(Lower Resin Layer)
Urethane acrylate (manufactured by Shin Nakamura Chemical Co., Ltd., product name: UA-7100): 31 weight %
Polyfunctional acrylate (manufactured by Shin Nakamura Chemical Co., Ltd., product name: ATM-35E): 40 weight %
Polyfunctional acrylate (manufactured by Shin Nakamura Chemical Co., Ltd., product name: A-TMM-3LM-N): 27.5 weight %
Photopolymerization initiator (manufactured by BASF, product name: IRGACURE819): 1.5 weight %

(Upper Resin Layer)
Fluorine-containing monomer (manufactured by DAIKIN INDUSTRIES, LTD., fluoric additive, product name: OPTOOL DAC-HP): 130 weight %
Reactive diluting agent (amide group containing monomer (manufactured by KJ Chemicals Corporation, product name: ACMO)): 90 weight %

(Curing Conditions)
The lower resin layer and the upper resin layer were irradiated with ultraviolet light (irradiation amount: 200 mJ/cm$^2$) from the base film side using a UV lamp manufactured by Fusion UV Systems (product name: LIGHT HANMAR6J6P3) while the upper resin layer was pressed against a predetermined moth-eye mold, whereby the lower resin layer and the upper resin layer were cured.

(Moth-Eye Structure of Sample Films)
Shape of raised portions: conical (bell-like shape)
Adjoining distance of raised portions ($D_{int}$): 200 nm
Height of raised portions ($D_h$): 200-250 nm The contact angle of the sample films with respect to water was initially 155°. After being exposed outdoors for three months, the contact angle of the sample films with respect to water did not decrease. The contact angle of the sample films with respect to water in a high-temperature, high-humidity environment (60° C., 95 RH %) was initially 150° and did not decrease even after three months. The contact angle of the sample films with respect to hexadecane was not less than 90°.

In this specification, the contact angle was measured at three locations using a portable contact angle meter (product name: PCA-1) manufactured by Kyowa Interface Science Co., Ltd. by a θ/2 method (calculated with θ/2=arctan (h/r). θ is contact angle, r is liquid drop radius, h is liquid drop height), and the measurements at the three locations were averaged. Herein, the first measurement location was selected in a central portion of the sample films. The second and third measurement locations were selected such that they away from the first measurement location by 20 mm or more and they were in point symmetry with respect to the first measurement location.

The sample films had excellent antireflection property and abrasion resistance. As for the reflectance, the value of 5-degree specular reflectance (V-560 manufactured by JASCO Corporation, wavelength range 250-850 nm) was not more than 0.1%. As for the abrasion resistance, the surface of the polymer film was rubbed with cleaning cloth (Toraysee (registered trademark) manufactured by TORAY INDUSTRIES, INC.) and steel wool (#0000 manufactured by Nippon Steel Wool Co., Ltd.) using a tester (14FW manufactured by Shinto Scientific Co., Ltd.) under the conditions that the diameter was 11 mm, the load was 200 g/cm$^2$, the stroke was 25 mm, and the velocity was 50 mm/sec, and the number of abrasion strokes and the variation of the contact angle with respect to water were examined. In a test with the cleaning cloth, the contact angle with respect to water after 1000 abrasion strokes was still 150° (the initial value was 155°), keeping a high value. In a test with the steel wool, the contact angle with respect to water was 140° after 100 abrasion strokes, 130° after 200 abrasion strokes, and decreased to 100° after 1000 abrasion strokes. When rubbed with the steel wool, the moth-eye structure was abraded away at around 100 strokes.

A window member (sample) of the optical device case was produced using the above-described sample films and evaluated as to anti-ice/snow adhesion property, antifog property, durability, maintainability, and power consumption. Example 1 has the configuration of the window member 20A shown in FIG. 1. Example 2 has the configuration of the window member 20C shown in FIG. 3. Reference Example 1 has a commercially-available water-repellent coating (contact angle with respect to water: 110°) on the front surface of the substrate and a heater on the rear surface. Herein, an ITO layer was used as the heater (resistance heater). The thickness of the ITO layer was not more than about 100 nm. The sheet resistance was not more than about 100 Ω/sq. For example, the sheet resistance is about 50 Ω/sq in a 24 V specification. For the sake of comparison, a substrate used for the window member (polycarbonate plate: thickness 2 mm, size 100 mm×100 mm) was solely evaluated.

The evaluation results are shown in TABLE 1.

As for the anti-ice/snow adhesion property, water drops were placed on the surface of the samples and frozen in a freezer (−5° C., 1 hour), and it was checked whether or not adhered ice falls off on light impact. ○: Ice tell off on light impact. Δ: Ice slipped off with being melted. x: Ice did not tall off at all.

The antifog property was evaluated using an antifog property tester (AFA-1 manufactured by Kyowa Interface Science Co., Ltd.). ○: Evaluation index was not more than 5.0. Δ: Evaluation index was more than 5.0 and not more than 10. x: Evaluation index was not less than 20.

The durability was evaluated based on the variation in performance after the samples were exposed outdoors for three months. ○: No problem. x: Significant deterioration in performance.

The maintainability was evaluated based on the necessity to replace the member. ○: Not necessary. Δ: Replacement with low frequency (1 year or more). x: Replacement with high frequency (within 6 months).

The power consumption was evaluated based on the power consumed in driving the heater. ○: Not more than 10 W. Δ: Not more than 15 W. x: Not less than 16 W.

TABLE 1

|  | Only substrate | Reference Example 1 | Example 1 | Example 2 |
|---|---|---|---|---|
| Anti-ice/snow adhesion property (initial) | X | Δ | ○ | ○ |
| Antifog property (initial) | X | Δ | Δ | ○ |
| Durability (long term) | X | X | ○ | ○ |
| Maintainability | X | X | Δ | ○ |
| Power consumption (W) | — | X | Δ | ○ |

As understood from the results shown in TABLE 1, the window members of Example 1 and Example 2 are excellent in anti-ice/snow adhesion property and durability. Example 2 is also excellent in antifog property because Example 2 includes a hydrophilic layer (porous alumina layer). Example 1 is somewhat inferior in antifog property because Example 1 does not have sufficient countermeasure against dew condensation. Example 1 is somewhat inferior in maintainability because the electrodes can corrode due to dew condensation. Example 1 consumes greater power than Example 2 because Example 1 requires extra electric power for prevention of dew condensation.

INDUSTRIAL APPLICABILITY

The embodiments of the present invention are suitably used in various optical devices installed outdoors, for example, lamps for various signal lights, cameras (for example, surveillance cameras, car cameras), and optical detection devices (for example, vehicle detectors).

REFERENCE SIGNS LIST

10: housing
12: space
20: resistance heater
20A, 20B, 20C, 20D: window member
22: light-transmitting member
23, 27: adhesive layer
24: resistance heater (transparent conductive layer)
34A, 35B, 35C: photocured resin layer
34Ap, 35Bp, 35Cp: raised portions
35a: lower resin layer
35b: upper resin layer
39: oxide layer (silicon dioxide layer)
42A, 42B, 42C: base film
50, 50A, 50B, 50C: polymer film
60B, 60C, 60D: hydrophilic layer
100A, 100B, 100C, 100D: optical device case
OE: optical element (LED element)

The invention claimed is:

1. An optical device case comprising:
a light-transmitting window member; and
a housing which has a space for accommodating a light-receiving element and/or a light-emitting element, wherein
the window member includes a light-transmitting member, a polymer film provided on an outer surface of the light-transmitting member, the polymer film having a moth-eye structure at its surface, a contact angle of the surface with respect to water being not less than 140°, and a resistance heater provided on an inner surface of the light-transmitting member,
a hydrophilic layer is provided on an inner side of the resistance heater,
a contact angle of a surface of the hydrophilic layer with respect to water is not more than 20°,
the resistance heater includes a transparent conductive layer formed on the inner surface of the light-transmitting member,
the hydrophilic layer includes a porous alumina layer provided on the transparent conductive layer,
the porous alumina layer has an inverted moth-eye structure at its surface,
the transparent conductive layer includes an indium-doped tin oxide (ITO) layer, and
the window member further includes an antimony-doped tin oxide (ATO) layer and/or a fluorine-doped tin oxide (FTO) layer between the indium-doped tin oxide (ITO) layer and the porous alumina layer.

2. The optical device case of claim 1, wherein the hydrophilic layer includes a polymer layer which has a moth-eye structure at its surface.

3. The optical device case of claim 1, wherein the porous alumina layer contains Ti.

4. A lamp for a signal light, comprising:
the optical device case as set forth in claim 1; and
an LED element provided inside the optical device case.

5. A camera comprising:
the optical device case as set forth in claim 1; and
an image sensor provided inside the optical device case.

6. An optical detection device comprising:
the optical device case as set forth in claim 1; and
a photosensor provided inside the optical device case.

7. The optical device case of claim 1, wherein the surface of the porous alumina layer does not include a plurality of recessed portions having a greater average value of a two-dimensional size when viewed in a direction normal to the surface of the porous alumina layer than an average value of a two-dimensional size of a plurality recessed portions that defines the inverted moth-eye structure when viewed in the direction normal to the surface of the porous alumina layer.

8. An optical device case comprising:
a light-transmitting window member; and
a housing which has a space for accommodating a light-receiving element and/or a light-emitting element, wherein
the window member includes a light-transmitting member, a polymer film provided on an outer surface of the light-transmitting member, the polymer film having a moth-eye structure at its surface, a contact angle of the surface with respect to water being not less than 140°, and a resistance heater provided on an inner surface of the light-transmitting member,
a hydrophilic layer is provided on an inner side of the resistance heater,
a contact angle of a surface of the hydrophilic layer with respect to water is not more than 20°,
the hydrophilic layer includes a porous alumina layer,
the porous alumina layer has an inverted moth-eye structure at its surface, and
the surface of the porous alumina layer does not include a plurality of recessed portions having a greater average value of a two-dimensional size when viewed in a direction normal to the surface of the porous alumina layer than an average value of a two-dimensional size of a plurality recessed portions that defines the inverted moth-eye structure when viewed in the direction normal to the surface of the porous alumina layer.

9. The optical device case of claim 8, wherein the porous alumina layer contains Ti.

10. A lamp for a signal light, comprising:
the optical device case as set forth in claim 8; and
an LED element provided inside the optical device case.

11. A camera comprising:
the optical device case as set forth in claim 8; and
an image sensor provided inside the optical device case.

12. An optical detection device comprising:
the optical device case as set forth in claim 8; and
a photosensor provided inside the optical device case.

* * * * *